United States Patent
Wu et al.

[11] Patent Number: 5,952,693
[45] Date of Patent: Sep. 14, 1999

[54] CMOS SEMICONDUCTOR DEVICE COMPRISING GRADED JUNCTIONS WITH REDUCED JUNCTION CAPACITANCE

[75] Inventors: David Wu, San Jose; Scott Luning, San Francisco, both of Calif.

[73] Assignee: Advanced Micro Devices, Inc., Sunnyvale, Calif.

[21] Appl. No.: 08/923,996

[22] Filed: Sep. 5, 1997

[51] Int. Cl.$^6$ .......................... H01L 29/78; H01L 21/336
[52] U.S. Cl. .......................... 257/344; 257/336; 257/408; 257/917
[58] Field of Search .................................. 257/344, 336, 257/408, 917

[56] References Cited

U.S. PATENT DOCUMENTS

| | | | |
|---|---|---|---|
| 4,894,694 | 1/1990 | Cham et al. | 257/344 |
| 5,254,866 | 10/1993 | Ogoh | 438/231 |
| 5,396,098 | 3/1995 | Kim et al. | 257/344 |
| 5,440,165 | 8/1995 | Mitsugana et al. | 257/344 |
| 5,654,212 | 8/1997 | Jang | 257/369 |
| 5,827,747 | 10/1998 | Wang et al. | 257/344 |

FOREIGN PATENT DOCUMENTS

| | | | |
|---|---|---|---|
| 61005571 | 1/1986 | Japan . | |
| 406132489 | 5/1994 | Japan | 257/344 |

OTHER PUBLICATIONS

Nayak, Deepak K., "A Comprehensive Study of Performance and Reliability of P, As, and Hybrid As/P nLDD Junctions for Deep–Submicron CMOS Logica Technology", IEEE Electron Device Letters, vol. 18, No. 6, 1997, pp. 281–283.

*Primary Examiner*—Peter Toby Brown
*Assistant Examiner*—Hung Van Duong

[57] ABSTRACT

A CMOS semiconductor device is formed having an N-channel transistor comprising a graded junction with reduced junction capacitance. The graded junction is achieved by forming a second sidewall spacer on the gate electrode, after source/drain implantations, and ion-implanting an N-type impurity with high diffusivity, e.g., P into an $A_s$ implant, followed by activation annealing.

12 Claims, 4 Drawing Sheets

CMOS SEMICONDUCTOR DEVICE COMPRISING GRADED JUNCTIONS WITH REDUCED JUNCTION CAPACITANCE

TECHNICAL FIELD

The present invention relates to a semiconductor device and method of manufacturing the semiconductor device having reduced junction capacitance. The invention is particularly applicable to high density CMOS semiconductor devices with design features of 0.25 microns and under.

BACKGROUND ART

The escalating requirements for high densification and performance associated with ultra large scale integration semiconductor devices requires design features of 0.25 microns and under, such as 0.18 microns and under, increased transistor and circuit speeds, high reliability and increased manufacturing throughput for competitiveness. The reduction of design features to 0.25 microns and under challenges the limitations of conventional semiconductor manufacturing technology.

The aggressive scaling of gate electrode dimensions into the deep submicron regime, such as less than about 0.25 microns, demands extremely shallow junctions to maintain good short channel characteristics and current drive. For example, semiconductor devices having design features of about 0.25 microns require a significantly reduced lightly doped drain (LDD) junction depth ($X_J$) of less than about 800 Å. Conventional methodology comprises ion implanting an N-type impurity (N) having a low diffusion coefficient, typically arsenic (As). The formation of a sharp N-LDD junction requires the power supply voltage ($V_{dd}$) to be reduced in order to maintain sufficient hot carrier reliability. While attractive from a power dissipation standpoint, a lower $V_{dd}$ compromises speed and current drive required for microprocessors particularly for desktop applications. Thus, hot carrier injection (HCI) reliability has become the limiting factor for performance of N-channel MOSFETs, particularly as the design rules shrink. A reduction in the HCI lifetime is attributed to the sharp N-LDD junction which causes a high peak electric field in the channel region.

D. Nayak et al., in "A Comprehensive Study of Performance and Reliability of P, As, and Hybrid As/P N-LDD Junctions for Deep-Submicron CMOS Logic Technology," IEEE Electron Device Letters, Vol. 18, No. 6, 1997, pp. 281–283, disclose a method of N-LDD junction grading to decrease the peak electric field in the channel, thereby improving the HCI lifetime. The disclosed technique comprises ion implanting As and P to form the N-LDD implant. While this technique was reported to improve the HCI lifetime in semiconductor devices having 0.35 micron technology, such a hybrid As/P-LDD technique cannot be directly applied to semiconductor devices having design features of about 0.25 microns and below, because the Off-current is increased to an unacceptably high level.

In copending application Ser. No. 08/924,644 a method is disclosed comprising ion implanting a rapidly diffusing N-type impurity, such as P, into a doped (As) source/drain implant after sidewall spacer formation. Upon activation annealing, a graded N-LDD junction is formed with an attendant significant increase the HCI lifetime without an increase in the Off-current. In copending application Ser. No. 08/979,364, a method is disclosed comprising plural ion-implantations (As) at different dosages and different angles to the semiconductor substrate. Upon activation annealing, a graded N-LDD junction is formed with an attendant increase in the HCI lifetime.

In copending application Ser. No. 08/924,640 filed on Sep. 5, 1997, a method is disclosed for independently forming source/drain regions of a P-channel and N-channel transistor of a CMOS semiconductor device employing plural sidewall spacers for independent control of the respective lengths of the channel regions.

In high performance oriented integrated circuits, such as those employed in microprocessors, capacitance loading must be reduced to as great an extent as possible to avoid reductions in circuit speed. Accordingly, there exists a need for semiconductor methodology and devices having a reduced junction capacitance. There exists an even greater need for semiconductor methodology and devices having a design rule of about 0.25 microns and under having reduced junction capacitance.

DISCLOSURE OF THE INVENTION

An object of the present invention is a method of manufacturing a semiconductor device exhibiting reduced junction capacitance.

Another object of the present invention is a semiconductor device exhibiting reduced junction capacitance.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, comprising: forming a dielectric layer on a surface of a semiconductor substrate; forming a conductive layer on the dielectric layer; patterning to form a gate electrode, having side surfaces, on the surface of the semiconductor substrate in an N-channel transistor region with a gate dielectric layer therebetween; using the gate electrode as a mask, ion implanting a first N-type impurity to form a lightly doped drain (N-LDD) implant: forming a first sidewall spacer, having a first width, on the side surfaces of the gate electrode; using the gate electrode and first sidewall spacer as a mask, ion implanting the first N-type impurity to form a moderately or heavily doped source/drain implant in the semiconductor substrate; forming a second sidewall spacer, having a second width, on the first sidewall spacer; using the gate electrode and the first and second sidewall spacers thereon as a mask, implanting a second N-type impurity, different from the first N-type impurity, to form a second N-type impurity implant in the semiconductor substrate; activation annealing to form: an N-LDD region, comprising the first N-type impurity, extending to a first depth below the surface of the semiconductor substrate; a moderately or heavily doped source/drain region, comprising the first N-type impurity, extending to a second depth greater than the first depth; and a region comprising the second N-type impurity extending to a third depth, greater than the second depth and forming a graded junction extending under the source/drain region, thereby reducing junction capacitance.

Another aspect of the present invention is a CMOS semiconductor device having N- and P-channel transistors, the N-channel transistor comprising: a gate electrode on a surface of a semiconductor substrate with a gate dielectric layer therebetween, the gate electrode having side surfaces with first and second sidewall spacers sequentially formed thereon; a lightly doped drain (N-LDD) region, comprising the first N-type impurity, extending to a first depth below the surface of the semiconductor substrate; a moderately or heavily doped source/drain region, comprising a first N-type impurity region, extending to a second depth greater than the first depth; and a region, comprising a second N-type impurity different from the first N-type impurity, extending to a third depth, greater than the second depth, and forming a graded junction extending under the source/drain region, thereby reducing junction capacitance.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

The present invention enables the manufacture of semiconductor devices exhibiting reduced capacitance loading, thereby enabling increased circuit speeds which are particularly advantageous in microprocessors. This objective has proven quite elusive, particularly in CMOS semiconductor devices having a design rule of about 0.25 microns and under. A semiconductor device produced in accordance with the present invention exhibits reduced capacitance loading by virtue of the strategic formation of a graded N-LDD junction. The inventive method of forming the graded N-LDD junction comprises forming N-LDD and N-source/drain implants containing an N-type impurity having a low diffusion coefficient, such as As, subsequently forming an additional sidewall spacer, implanting an N-type impurity having a high diffusion coefficient, such as P, followed by activation annealing.

The hybrid As/P-LDD junctions reported in the previously mentioned Nayak et al. publication achieve an increase in the HCI lifetime at the cost of an undesirable increase in the Off-current, which is unacceptable for product design involving deep submicron technology of about 0.25 microns and under. The graded N-LDD junctions disclosed in copending application Ser. No. 08/924,644 result in an increased HCI lifetime without an attendant decrease in the Off-current and an increase in N-channel transistor performance. However, the graded N-LDD junctions disclosed by Nayak et al. and in copending application Ser. No. 08/924,644 do not effectively reduce capacitance loading, which problem becomes acute in semiconductor devices having design features of about 0.25 microns and under. In accordance with the present invention, upon activation annealing, the rapidly diffusing impurity (P) diffuses to form a graded junction at a sufficient distance from the channel region and extending below the bottom of the source/drain region, thereby significantly reducing junction capacitance.

Figure 1:
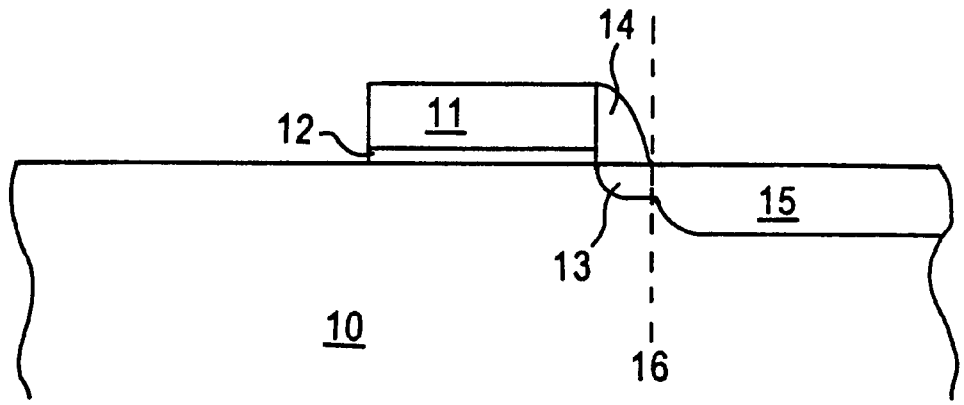
FIG. 1 schematically illustrates a conventional N-LDD source/drain junction.

Adverting to FIG. 1, a conventional N-channel transistor comprises substrate 10 and gate electrode 11 formed thereon with gate oxide layer 12 therebetween. An N-LDD implant, for subsequently activated N-LDD region 13, is formed by ion implantation using the gate electrode as a mask, of an N-type impurity, such as As because of its low diffusion coefficient, typically at an implantation dosage of about $1 \times 10^{13}$ atoms/cm$^{-2}$ to about $1 \times 10^{14}$ atoms/cm$^{-2}$ at an energy of about 10 KeV to about 30 KeV. Sidewall spacer 14 is then formed on the side surfaces of gate electrode 11 and ion implantation is conducted to form the moderately or heavily doped source/drain region implant for the adjoining subsequently activated N-source/drain region 15 by ion implanting As at an implantation energy of about $5 \times 10^{14}$ atoms/cm$^{-2}$ to about $5 \times 10^{15}$ atoms/cm$^{-2}$ at an energy of about 20 KeV to about 60 KeV. Activation annealing is then conducted at a temperature of about 1,000° C. to about 1,200° C. for about 10 seconds to about 60 seconds, to activate the N-LDD 13 and source/drain 15 regions. As shown at dotted line 16, the junction between N-LDD region 13 and source/drain region 15 is rather precipitous. The sharp junction between the N-LDD junction 13 and N-source/drain region 15 exhibits a high junction capacitance which undesirably reduces circuit speed.

The present invention enables the manufacture of semiconductor devices comprising an N-channel transistor having significantly reduced junction capacitance and, hence, increased circuit speed. This objective is achieved by forming a second sidewall spacer, on the first sidewall spacer after ion implanting N-type impurities to form a moderately or heavily doped source/drain implant. Subsequent to forming the source/drain implant, an impurity having a higher diffusion coefficient than that employed for the source/drain implant, e.g., P as when employing As for the source/drain implant, is ion implanted using the gate electrode and first and second sidewall spacers as a mask. Upon activation annealing, P diffuses more rapidly and to a greater extent than As and, hence, forms a graded junction extending below the source/drain region gradually decreasing in concentration toward the substrate. Hence, a graded junction is formed which is spaced apart from the channel region a sufficient distance to reduce capacitance loading and, hence, increase circuit speed.

Figure 2:
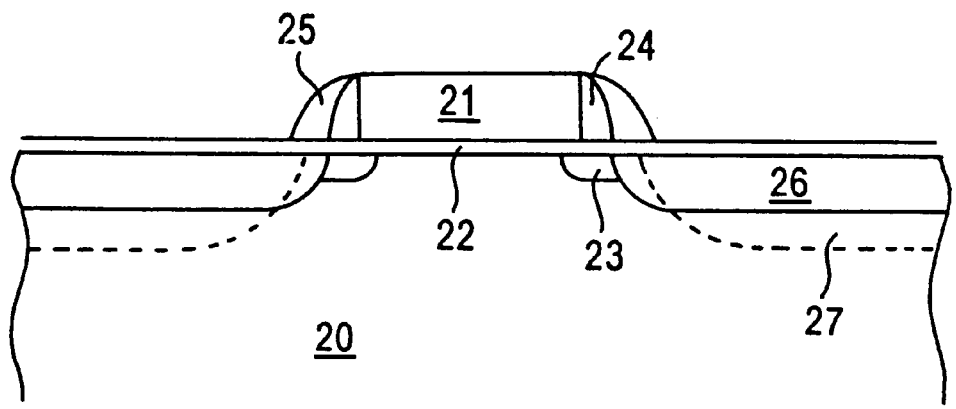
FIG. 2 illustrates an embodiment in accordance with the present invention.

In accordance with the present invention, adverting to FIG. 2, gate electrode 21 of an N-channel transistor is formed on the semiconductor substrate 20 with a gate dielectric layer 22 therebetween. Typically, the semiconductor substrate comprises doped monocrystalline silicon, the dielectric layer comprises silicon oxide and the gate electrode comprises doped polycrystalline silicon. A first N-type impurities are ion implanted into semiconductor substrate 20, employing gate electrode 21 as a mask, to form an N-LDD implant which ultimately forms N-LDD region 23. Sidewall spacer 24 is then formed on the side surfaces of the gate electrode 21. Sidewall spacer 24 can comprise an insulating material, such as a silicon oxide, a silicon nitride or a silicon oxynitride. Sidewall spacer 24 is formed at a suitable width for optimum N-LDD junction characteristics. For example, it was found suitable to form sidewall spacer 24 at a width of about 150 Å to about 200 Å. Sidewall spacer 24 can be formed in a conventional manner, as by depositing a layer of insulating material by chemical vapor deposition and anisotropically etching. Anisotropic etching can be performed so that a portion of the underlying gate dielectric layer remains to serve as an oxide screen for subsequent moderate or heavy ion implantations. Alternatively, a thermal oxide screen layer can be formed or, preferably, vapor deposited as disclosed in copending application Ser. No. 08/924,639 to minimize transient enhanced diffusion of implanted impurities. The entire disclosure of copending application Ser. No. 08/924,639 is hereby incorporated by reference herein.

After formation of sidewall spacer 24, another N-type impurity is implanted, preferably the same as the first N-type impurity, to form a moderately or heavily doped source/drain implant. Typically, the first N-type impurity is As, which has a low diffusion coefficient. As is usually ion implanted at an implantation dosage of about $1\times10^{13}$ atoms/$cm^{-2}$ to about $1\times10^{14}$ atoms/$cm^{-2}$ at an energy of about 10 KeV to about 30 KeV to form the N-LDD implant. The moderately or heavily doped source/drain implant is typically formed by ion implanting As at an implantation energy of about $5\times10^{14}$ atoms/$cm^{-2}$ to about $5\times10^{15}$ atoms/$cm^{-2}$ at an energy of about 20 KeV to about 60 KeV.

In accordance with the present invention, subsequent to forming the doped source/drain implant, a second sidewall spacer 25 is formed on first sidewall spacer 24. Second sidewall spacer can comprise a material which is the same as or different from the material employed to form sidewall spacer 24. Sidewall spacer 25 can also comprise a silicon oxide, silicon nitride or silicon oxynitride. Sidewall spacer 24 and sidewall spacer 25 can also be formed in a conventional manner as, for example, by depositing a layer of the insulating material by a chemical vapor deposition technique and anisotropically etching.

After formation of sidewall spacer 25, a second N-type impurity is ion implanted which has a higher diffusion coefficient than the first N-type impurity (As), preferably P at an implantation energy of about $1\times10^{13}$ atoms/$cm^{-2}$ to about $1\times10^{14}$ atoms/$cm^{-2}$ at an energy of about 10 KeV to about 40 KeV to form a second N-type implant.

The width of the first sidewall spacer 24 is selected to optimize the length of the subsequently activated N-LDD region. The width of the second sidewall spacer 25 is selected to optimize the subsequently activated P region 27 having a graded junction sufficiently spaced from the channel region underlying gate electrode 21 to reduce capacitance loading. Given the objectives of the present invention, one having ordinary skill in the art can easily optimize the width of the first and second sidewall spacers. For example, it has been found suitable to employ a first sidewall spacer 24 having a width of about 150 Å to about 200 Å, and a second sidewall spacer having a width of about 700 Å to about 1,000 Å.

Activation annealing is then conducted to form N-LDD region 23, N-moderately or heavily doped source/drain region 26 containing As and N-region 27 containing P. Activation annealing can be conducted at a temperature of about 1,000° C. to about 1,200° C. for a period of time of about 10 seconds to about 60 seconds.

Figure 3:
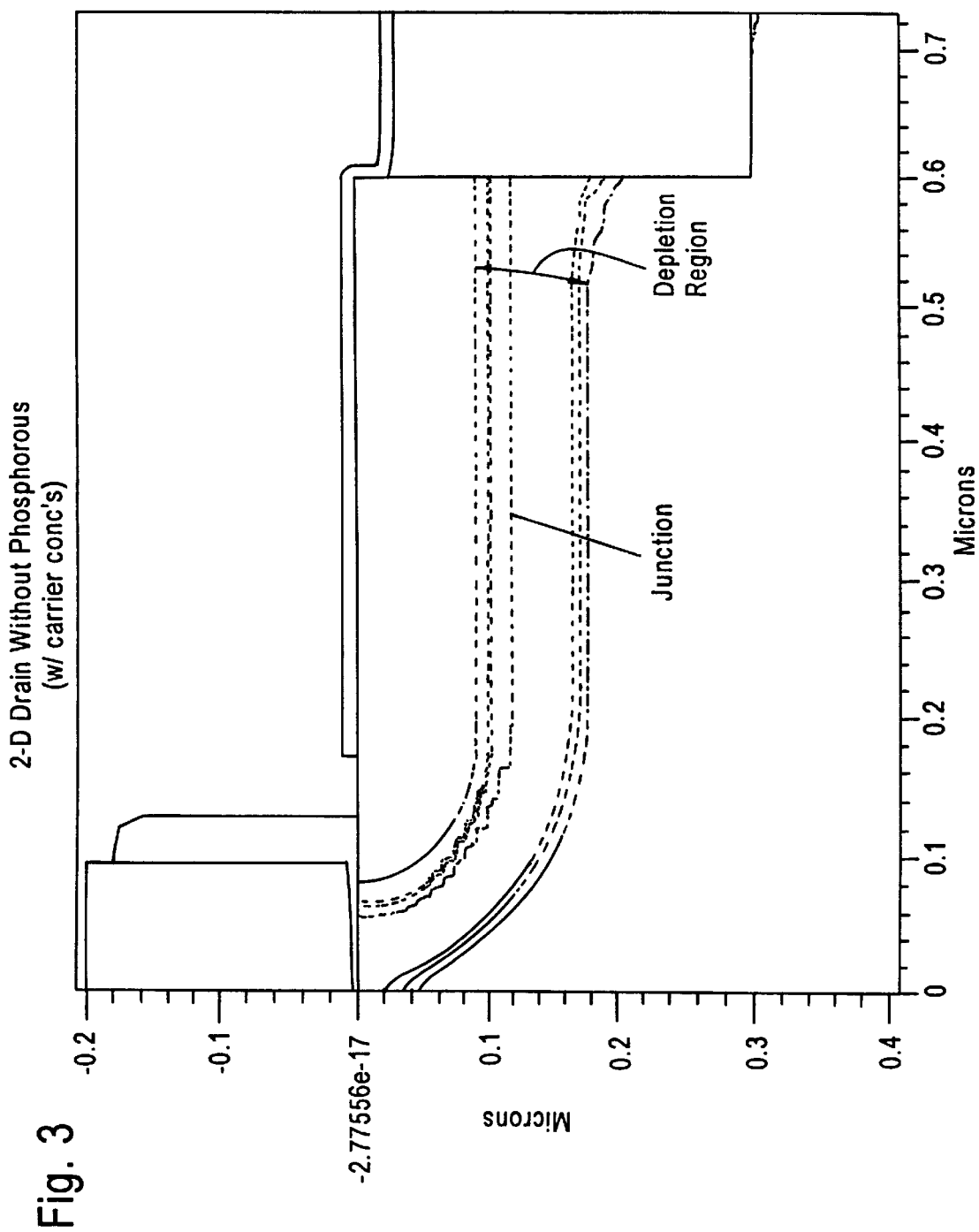
FIG. 3 depicts a computer simulation of a depletion region formed without employing phosphorous.
Figure 4:
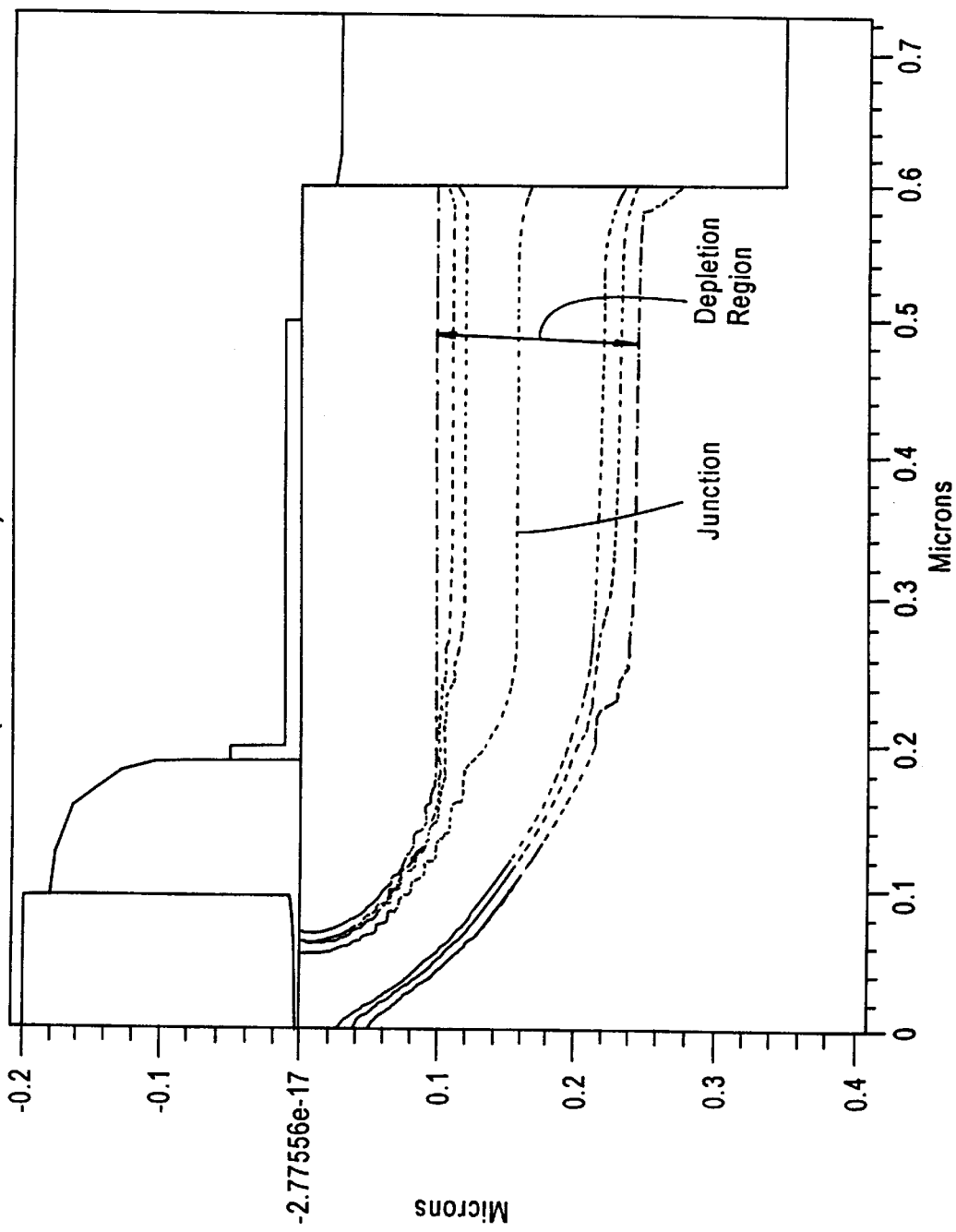
FIG. 4 depicts a computer simulation of a depletion region formed employing phosphorous.
Figure 5:
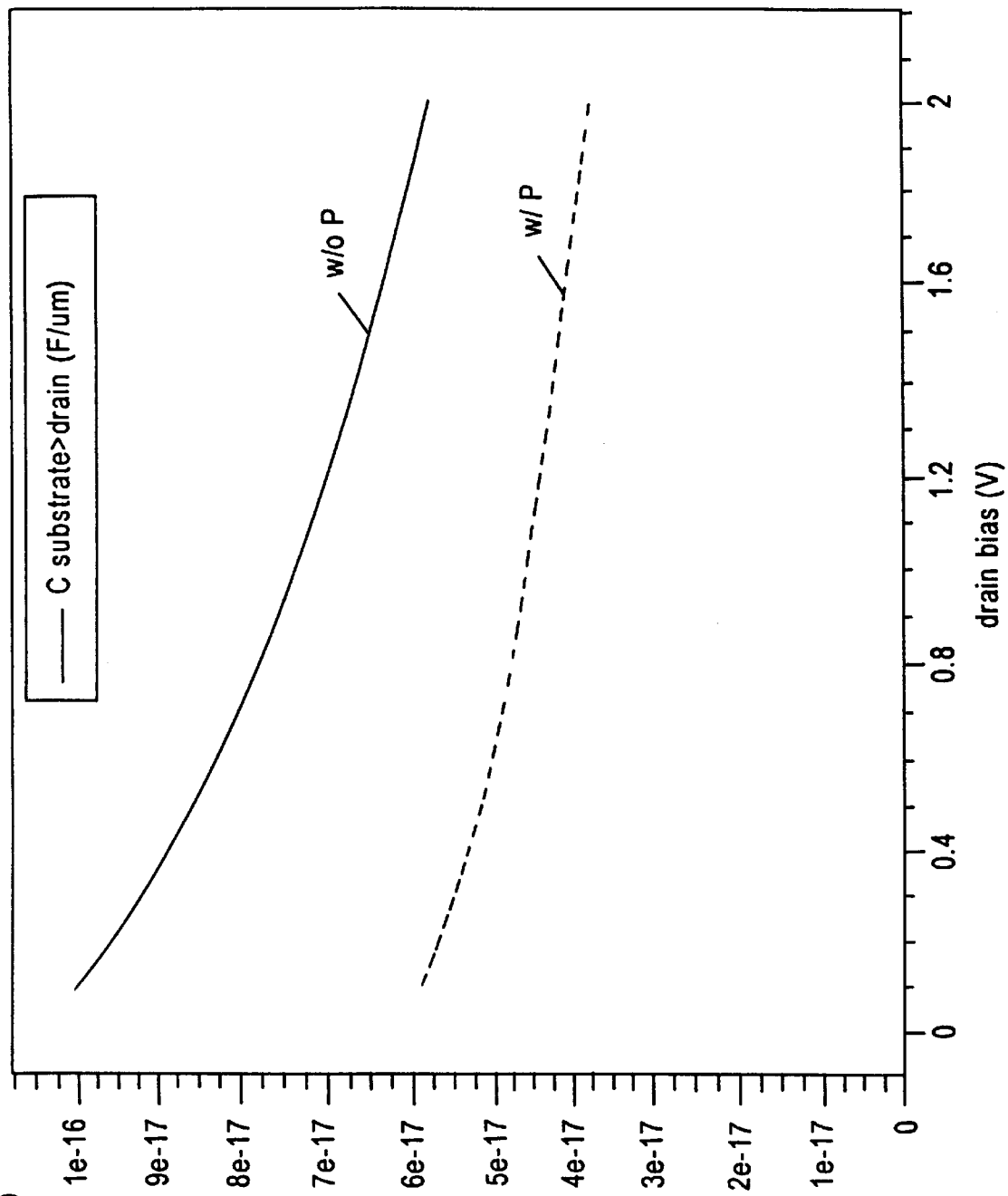
FIG. 5 depicts a capacitance calculation based on computer simulation with and without phosphorous.

As shown in FIG. 2, due to the high diffusivity of P, region 27 containing P is formed extending below source/drain region 26 and having an impurity concentration gradient which gradually decreases toward N-LDD region 23 forming a graded junction. The impact on the width of the depletion region attributed to employing phosphorous in accordance with the present invention can be appreciated by comparing FIG. 3 and FIG. 4. The advantageous reduction of the junction capacitance as a result of employing phosphorous in accordance with the present invention is illustrated in FIG. 5.

The graded junction formed by impurity region 27 is sufficiently spaced apart from the channel region to reduce capacitance loading and, hence, enable high circuit speeds. Typically N-LDD region 23 containing As extends to a depth below the surface of semiconductor substrate 20 to about 600 Å to about 900 Å, while source/drain region 26 extends to a greater depth, e.g., about 1,000 Å to about 1,500 Å. Impurity region 27 containing P extends to a depth greater than the depth of source/drain region, i.e., to a depth of about 2,000 Å to about 2,500 Å.

Thus, in accordance with the present invention, a rapidly diffusing N-type impurity, such as P, is introduced into a source/drain region comprising an N-type impurity with a low diffusion coefficient, such as As, after formation of a second sidewall spacer. Upon activation annealing, the P doped implant forms a graded junction exhibiting reduced junction capacitance, thereby enabling high circuit speeds. The present invention is applicable to the production of various types of semiconductor devices, particularly high density semiconductor devices with submicron features of about 0.25 microns and below, exhibiting high speed characteristics and improved reliability. The present invention is cost effective and can easily be integrated into conventional processing.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A CMOS semiconductor device having N- and P-channel transistors, the N-channel transistor comprising:
   a gate electrode on a surface of a semiconductor substrate with a gate dielectric layer therebetween, the gate electrode having side surfaces with first and second sidewall spacers sequentially formed thereon;
   a lightly doped drain (N-LDD) region, comprising the first N-type impurity, extending to a first depth below the surface of the semiconductor substrate;
   a moderately or heavily doped source/drain region, comprising a first N-type impurity region, extending to a second depth greater than the first depth; and a region, comprising a second N-type impurity different from the first N-type impurity, extending to a third depth, greater than the second depth, and forming a graded junction extending under the source/drain region, thereby reducing junction capacitance.

2. The semiconductor device according to claim 1, comprising N- and P-channel transistors having design features of 0.25 microns and under.

3. The semiconductor device according to claim 2, wherein the N- and P-channel transistors comprise design features of about 0.18 microns and under.

4. The semiconductor device according to claim 1, wherein the dielectric layer comprises a silicon oxide, and the substrate comprises doped monocrystalline silicon.

5. The semiconductor device according to claim 4, wherein the gate electrode comprises doped polycrystalline silicon.

6. The semiconductor device according to claim 1, wherein the second N-type impurity has a greater diffusion coefficient than the first N-type impurity.

7. The semiconductor device according to claim 6, wherein the first N-type impurity comprises arsenic, and the second N-type impurity comprises phosphorous.

8. The semiconductor device according to claim 1, wherein the first and second sidewall spacers comprise a silicon oxide, a silicon nitride or a silicon oxynitride.

9. The semiconductor device according to claim 1, wherein the first sidewall spacer has a width of about 100 Å to about 150 Å, and the second sidewall spacer has a width of about 700 Å to about 1,000 Å.

10. The semiconductor device according to claim 1, wherein the first depth is about 600 Å to about 900 Å, the second depth is about 1,000 Å to about 1,500 Å, and the third depth is about 2,000 Å to about 2,500 Å.

11. The semiconductor device according to claim 1, wherein the first sidewall and second spacers comprise a different insulating material.

12. A semiconductor device produced by the method according to claim 1.

* * * * *